US012402264B2

United States Patent
Ng et al.

(10) Patent No.: US 12,402,264 B2
(45) Date of Patent: Aug. 26, 2025

(54) STACKED POWER TERMINALS IN A POWER ELECTRONICS MODULE

(71) Applicant: SEMICONDUCTOR COMPONENTS INDUSTRIES, LLC, Phoenix, AZ (US)

(72) Inventors: Vemmond Jeng Hung Ng, Senawang (MY); Yushuang Yao, Shenzhen (CN); Chee Hiong Chew, Seremban (MY)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 182 days.

(21) Appl. No.: 18/060,695

(22) Filed: Dec. 1, 2022

(65) Prior Publication Data

US 2023/0180410 A1 Jun. 8, 2023

Related U.S. Application Data

(60) Provisional application No. 63/264,894, filed on Dec. 3, 2021.

(51) Int. Cl.
*H05K 5/02* (2006.01)
*H02M 3/00* (2006.01)
*H02M 7/00* (2006.01)

(52) U.S. Cl.
CPC .......... *H05K 5/0247* (2013.01); *H02M 3/003* (2021.05); *H02M 7/003* (2013.01)

(58) Field of Classification Search
USPC ........................................................ 361/807
See application file for complete search history.

(56) References Cited

U.S. PATENT DOCUMENTS

| | | | | |
|---|---|---|---|---|
| 6,024,589 | A * | 2/2000 | Hahn, IV | H05K 1/148 439/212 |
| 2002/0105068 | A1 | 8/2002 | Fukumoto et al. | |
| 2009/0002956 | A1 | 1/2009 | Suwa et al. | |
| 2010/0089641 | A1* | 4/2010 | Esmaili | H05K 7/14329 174/70 B |
| 2010/0178813 | A1* | 7/2010 | Holbrook | H05K 7/14329 439/775 |
| 2013/0285260 | A1 | 10/2013 | Denison et al. | |
| 2015/0131232 | A1* | 5/2015 | Ishino | H05K 1/185 361/707 |
| 2019/0020285 | A1 | 1/2019 | Kobolla et al. | |
| 2020/0161224 | A1* | 5/2020 | Xu | H01L 23/49517 |
| 2021/0210477 | A1* | 7/2021 | Gurpinar | H01L 23/3735 |
| 2021/0320055 | A1* | 10/2021 | Oomori | H01L 23/057 |

FOREIGN PATENT DOCUMENTS

| | | |
|---|---|---|
| DE | 102009046914 A1 | 8/2010 |
| WO | 2021144925 A1 | 7/2021 |

* cited by examiner

*Primary Examiner* — Hung S. Bui
(74) *Attorney, Agent, or Firm* — Brake Hughes Bellermann LLP

(57) ABSTRACT

A module includes a power circuit enclosed in a casing. A first power terminal and a second power terminal of the power circuit each extend to an exterior of the casing. The first power terminal and the second power terminal separated by a gap are disposed in a stack on the exterior of the casing.

22 Claims, 8 Drawing Sheets

STACKED POWER TERMINALS IN A POWER ELECTRONICS MODULE

RELATED APPLICATION

This application claims priority to, and the benefit of, U.S. Provisional Patent Application No. 63/264,894, filed Dec. 3, 2021, which is incorporated by reference in its entirety herein.

TECHNICAL FIELD

This disclosure relates to power electronics modules.

BACKGROUND

Some electrical or electronics equipment are powered by battery packs or fuel cells. For example, electric and hybrid electric vehicles utilize high voltage battery packs or fuel cells that deliver high power direct current to drive vehicle motors, electric traction systems and other vehicle systems. In addition, these vehicles can include power electronics modules (e.g., inverters, converters) to convert the direct current provided by, for example, the battery packs, to alternating current for use by electric motors and other electric devices and systems of the vehicle. A power electronics module can include semiconductor devices such an insulated-gate bipolar transistor (IGBT) and a fast recovery diode (FRD), etc. The semiconductor devices can be silicon-based devices or silicon carbide (SiC)-based devices. For thermal management of the heat generating semiconductor devices, the power electronics module may include cooling systems and may be packaged, for example, as a single side direct cooled (SSDC) power electronics module or a dual side cooled (DSC) power electronics module with signal pins and power terminals extending from the module.

SUMMARY

In a general aspect, a module includes a power circuit enclosed in a casing. A first power terminal and a second power terminal of the power circuit each extend to an exterior of the casing. The first power terminal and the second power terminal separated by a gap are disposed in a stack on the exterior of the casing.

In a general aspect, a package includes a power electronics module enclosed in a casing. The casing is made of polymeric materials. The package further includes a first power terminal and a second power terminal of the power electronics module extending to an exterior of the casing. The first power terminal and the second power terminal have mutually conforming shapes and are arranged in stack with a gap between the first power terminal and the second power terminal.

In a general aspect, a method includes arranging a positive direct current (DC) power terminal and a negative DC power terminal, with mutually conforming shapes extending from a casing enclosing a power electronics module, in a stack. The method further includes maintaining a gap between the positive DC power terminal and the negative DC power terminal with the mutually conforming shapes in the stack.

Figure 1:
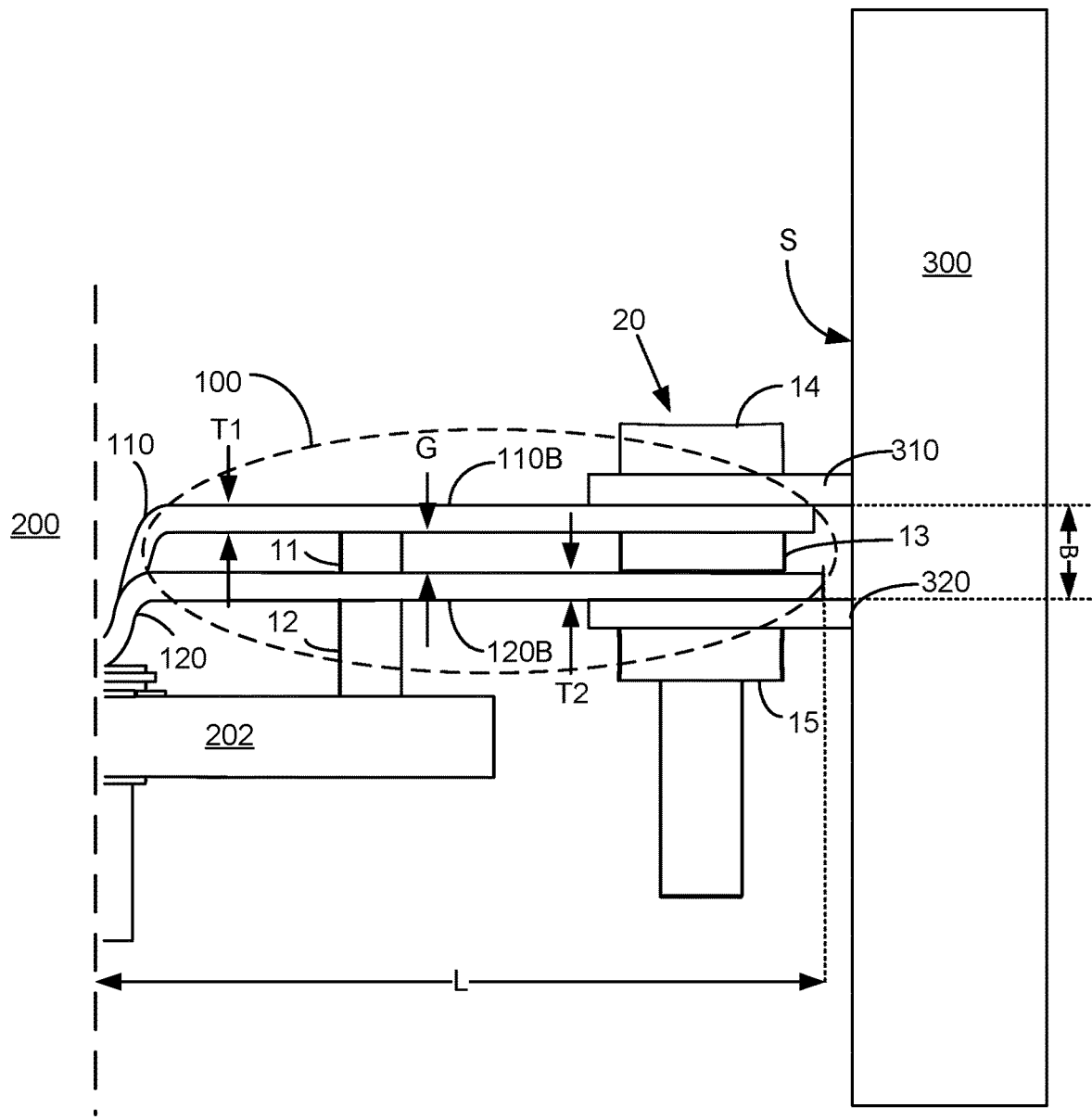
FIG. 1 illustrates a cross sectional side view of an example arrangement of power terminals of a power electronics module.

In the drawings, which are not necessarily drawn to scale, like reference symbols and/or alphanumeric identifiers may indicate like and/or similar components (elements, structures, etc.) in different views. The drawings illustrate, by way of example, but not by way of limitation, various implementations discussed in the present disclosure. Reference symbols and/or alphanumeric identifiers shown in one drawing may not be repeated for the same, and/or similar elements in related views in other drawings. Reference symbols and/or alphanumeric identifiers that are repeated in multiple drawings may not be specifically discussed with respect to each of those drawings but are provided for convenience in cross reference between related views. Also, not all like elements in the drawings are specifically referenced with a reference symbol and/or an alphanumeric identifier when multiple instances of an element are illustrated.

DETAILED DESCRIPTION

A power electronics module may, for example, be an inverter (e.g., a traction inverter) that is intended, for example, to control an electric motor of an electrical vehicle. Modern electrical vehicles may require large amounts of torque and acceleration. The responsiveness of the inverter and the electric motor it controls may correlate directly to the feel of the vehicle and consumer satisfaction. Power levels from 40 kW to 150+kW are common. High voltage batteries (e.g., 400 volt to 800 volt batteries) may supply power to the traction inverter, requiring inverter components to be rated from 600 volts to 1200 volts while operating at current levels up to 1000 A per phase.

In example implementations, a power electronics module may include switching circuits based on at least a semiconductor die (e.g., an insulated-gate bipolar transistor (IGBT) and/or a fast recovery diode (FRD)). The semiconductor die or dies may be mounted on a top surface of substrate (e.g., a printed circuit board, a direct bonded metal (DBM) substrate, a direct bonded copper (DBC) substrate, etc.). The semiconductor die or dies may be packaged (e.g., encapsulated in a molding compound), for example, as a single side direct cooled (SSDC) power electronics module with signal pins and power terminals extending from the module.

In example implementations, power terminals (e.g., direct current (DC) terminals, alternating current (AC) terminals, signal terminals, etc.) may be strips of metals that extend from a housing or casing enclosing the power electronics module. The power terminals (e.g., positive (+) DC terminal and a negative (−) DC terminal) of the power electronics module may be connected to a busbar of an application system (e.g., the electrical system of the electrical vehicle coupled to the power electronics module).

A switching speed of the semiconductor device circuits in the power electronics module may determine a power efficiency of the power electronics module coupled to the application system. The switching speed and hence the power efficiency of the power electronics module (e.g., a SSDC package) may be negatively influenced by stray inductance in the circuit (e.g., the stray inductance associated a DC+/DC− power terminal loop through the DC+terminal, the DC−terminal and the application system busbar).

Systems and methods for increasing the energy efficiency of a power electronics module (e.g., an inverter, a DC-DC converter, etc.) are disclosed herein.

The systems and methods involve a geometrical arrangement or configuration of the power terminals (e.g., a DC+terminal, and a DC−terminal) of the power electronics module to reduce any stray inductance associated with the DC+/DC− power terminal loop.

FIG. 1 shows a cross sectional side view of an example arrangement 100 of the DC power terminals (e.g., DC power terminal 110 and DC power terminal 120) of a power electronics module (e.g., power electronics module 200, FIG. 2), in accordance with the principles of the present disclosure.

Figure 2:
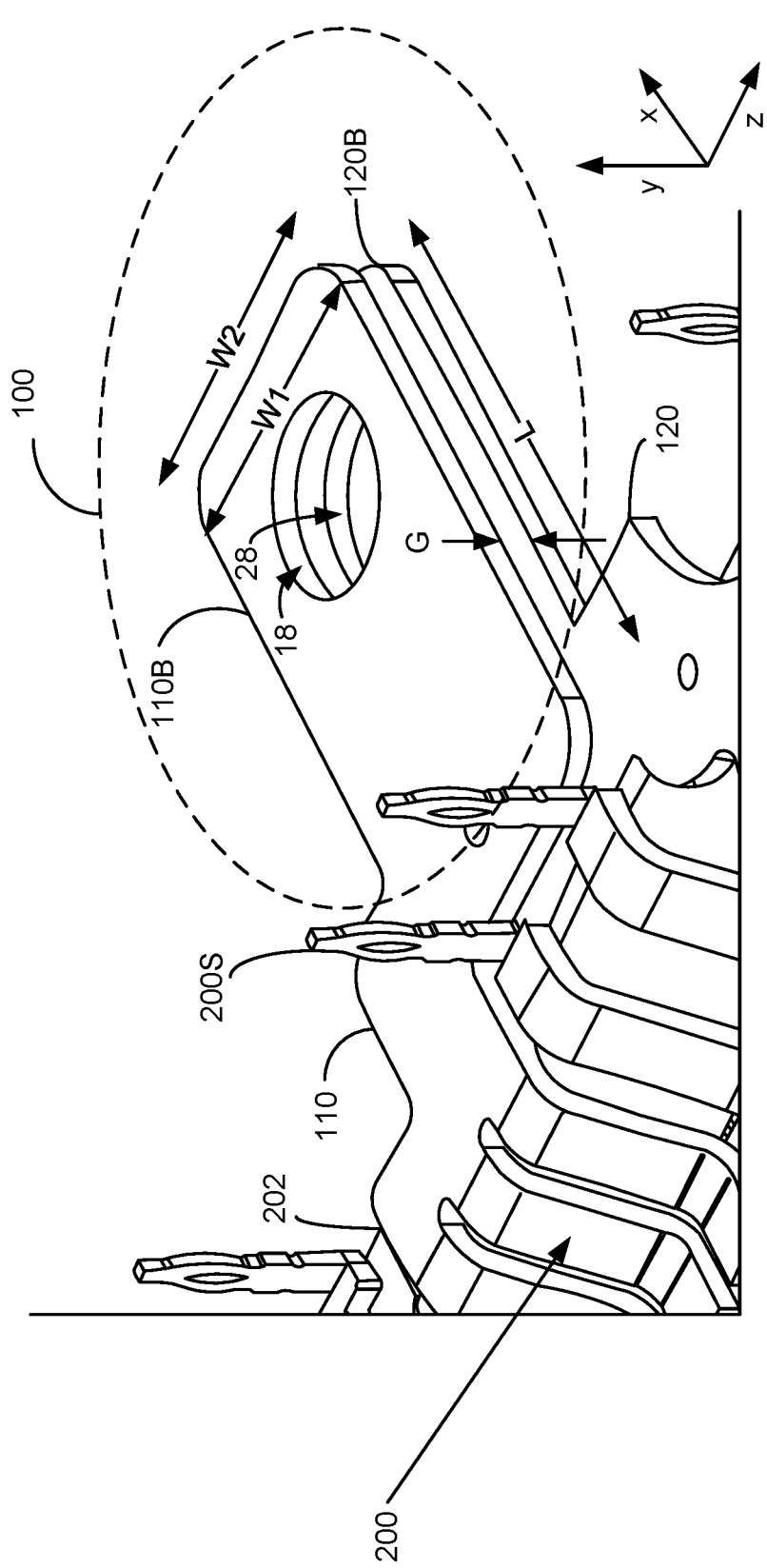
FIG. 2 illustrates a perspective side view of the example arrangement of the power terminals of the power electronics module of FIG. 1 with a top cover of a casing enclosing of the power electronics module removed.

Only an edge portion (e.g., edge 202) of a casing (e.g., casing 200C) enclosing power electronics module 200 is shown in FIG. 1. FIG. 1 also shows a busbar (e.g., busbar 300) of an application system connected to the power terminals (i.e., DC power terminal 110 and DC power terminal 120) of power electronics module 200. FIG. 2 illustrates a side view of the example arrangement 100 of the DC power terminal 110 and DC power terminal 120 with a top cover (casing cover 204, FIG. 3) of the casing enclosing power electronics module 200 removed. In addition to portions of the power terminals (i.e., DC power terminal 110 and DC power terminal 120) extending to the exterior of power electronics module 200, FIG. 2 shows portions of DC power terminal 110 and DC power terminal 120 extending to the interior of power electronics module 200 and also shows signal terminals (e.g., signal pin 200S) of the power electronics module 200 extending, for example, perpendicularly to edge 202 in the y direction.

As shown in FIG. 1, DC power terminal 110 and DC power terminal 120 may be made of strips of metal that extend (generally in the x direction) from the casing enclosing power electronics module 200. In example implementations, DC power terminal 110 and DC power terminal 120 may, for example, be made of metal (e.g., copper) and have a bare surface, a tin-nickel (Sn—Ni) plated surface, a tin (Sn) plated surface, or other solderable or laser-weldable plated surface for connection to a busbar of an application system.

DC power terminal 110 and DC power terminal 120 may, in general, have mutually conformal shapes. In other words, a shape (e.g., outer shape, holes, etc.) of the DC power terminal 110 and a shape of the DC power terminal 120 can be the same or can match. In some implementations, a shape of the DC power terminal 110 and a shape of the DC power terminal 120 can be the same or can match around at least 3 sides and including openings. In some implementations, a shape of the DC power terminal 110 and a shape of the DC power terminal 120 can be the same or can match when viewed along the y direction, which is orthogonal to a plane aligned parallel to the DC power terminal 110 and the DC power terminal 120.

Said differently, an outer profile of the DC power terminal 110 and an outer profile of the DC power terminal 120 can be the same or can match. In some implementations, an outer profile of the DC power terminal 110 and an outer profile of the DC power terminal 120 can be the same or can match around at least 3 sides. In some implementations, an outer profile of the DC power terminal 110 and an outer profile of the DC power terminal 120 can be the same or can match when viewed along the y direction, which is orthogonal to a plane aligned parallel to the DC power terminal 110 and the DC power terminal 120.

In some implementations, an outer profile of the DC power terminal 110 can be disposed within (e.g., disposed within at least 3 sides of) an outer profile of the DC power terminal 120 and/or an outer profile of the DC power terminal 120 can be disposed within (e.g., disposed within at least 3 sides of) an outer profile of the DC power terminal 110.

In some implementations, the DC power terminal 110 and the DC power terminal 120 lie (e.g., substantially lie) one above the other in a stack. As shown in FIG. 1 and FIG. 2, for example, DC power terminal 110 (e.g., a DC+power terminal) may include a straight beam portion (e.g., beam 110B) extending away from the edge portion of power electronics module 200 in the x direction, and DC power terminal 120 (e.g., a DC−power terminal) may include a straight beam portion (e.g., beam 120B) extending away from the edge portion of power electronics module 200 in the x direction. In example implementations, beam 110B and beam 120B may extend to about a length L (e.g., in the x direction) away from the edge portion of electronics module 200. Beam 110B and beam 120B may have widths W1 and W2 (FIG. 2), respectively, (in the z direction). Further, beam 110B and beam 120B may have a thickness T1 and a thickness T2, respectively (in the y direction).

In arrangement 100, straight beam portion (e.g., beam 120B) of DC power terminal 110 and straight beam portion (e.g., beam 120B) of DC power terminal 120 may be disposed in stack one above the other (e.g., in a vertical stack with beam 110B disposed above beam 120B) with a distance or gap G (in the y direction) between the two beams.

In example implementations, an insulating material may be disposed in the gap G between the two beams (e.g., for increase creepage in arrangement 100). In some implementations, the insulating material can have a thickness of the gap G. In some implementations, the insulating material can have a shape (e.g., outer profile, shape including holes) that matches that of the DC power terminal 110 and/or the shape (e.g., outer profile, shape including holes) of the DC power terminal 120.

Beam 110B and beam 120B may have holes (e.g., holes 18 and hole 28, FIG. 2) passing through the thicknesses of the beams. Hole 18 and hole 28 may be aligned with each other so that a single screw or bolt (e.g., screw 14 of a screw-washer-nut assembly 20) can pass through both hole 18 and hole 28 across both beam 110B and beam 120B in a vertical direction (e.g., y direction).

In example implementations, beam 110B may be spaced apart from edge 202 by an insulating post 12, and beam 120B may be spaced apart from beam 110B below (in the y direction) by an insulating spacer or washer 11.

In example implementations, for an instance where power electronics module 200 is an SSDC package, the beam portions (e.g., beam 110B and beam 120B) may have the following example dimensions: length L may be between about 10 mm and 20 mm (e.g., 15 mm); widths W1 and W2 may be between about 10 mm and 20 mm (e.g., 14 mm); and thickness T1 and T2 may be between about 0.7 mm and 2 mm (e.g., 1 mm, 1.5 mm, etc.).

In example implementations, the distance or gap G between beam 110B of DC power terminal 110 (e.g., a DC+power terminal) and beam 120B of DC power terminal 120 (e.g., a DC−power terminal) may be between about 1 mm and 2 mm (e.g., 1.5 mm, etc.). In some implementations, the distance or gap G between beam 110B of DC power terminal 110 (e.g., a DC+power terminal) and beam 120B of DC power terminal 120 (e.g., a DC−power terminal) can correspond to a distance of less than 5 mm.

This close spacing (e.g., 1 mm to 2 mm) between the major surfaces of the beam portions of DC power terminal 110 and DC power terminal 120, and the generally conformal shapes of DC power terminal 110 and DC power terminal 120 will reduce any stray inductance associated with a DC+/DC− power terminal loop created through the power terminals when power electronics module 200 is coupled to a busbar (e.g., busbar 300, FIG. 1) of an application system.

As shown in FIG. 1, busbar 300 may be coupled to power electronics module 200 by respectively coupling busbar tab 310 and busbar tab 320 (extending, e.g., in the −x direction, from busbar 300) to beam 110B and beam 120B of the power terminals of the power electronics module.

Busbar tab 310 and busbar tab 320 may, for example, be rectangular pieces of metal or other conductive material. Busbar tab 310 and busbar tab 320 may have comparable rectangular dimensions and may extend from a side S of from busbar 300 separated by distance B. Busbar tab 310 may lie directly above busbar tab 320 (e.g., in the y direction). Busbar tab 310 and busbar tab 320 may each have a width W (in the z direction, FIG. 3) that is about a same or comparable to the width (width W1 and W2) of DC power terminal 110 or DC power terminal 120.

In example implementations, to couple power electronics module 200 to busbar 300, busbar tab 310 may be positioned to contact a top surface of beam 110B from above, and busbar tab 320 may be positioned to contact a bottom surface of beam 120B from below. The assembly of the busbar tabs (busbar tab 310 and busbar tab 320) and the beams (beam 110B and beam 120B) may be held together by an insulating screw-and-nut assembly 20 (including, e.g., screw 14, spacer or washer 13 and nut 15). In example implementations, busbar tab 310, busbar tab 320, beam 110B and beam 120B may have sizes and rectangular dimensions (e.g., rectangular lengths and widths) such that a single screw-and-nut assembly (insulating screw-washer-and-nut assembly 20) can be used to hold the assembly together.

In example implementations, busbar tab 310 and busbar tab 320 may be made of metal (e.g., copper) with a bare surface, a tin-nickel (Sn—Ni) plated surface, a tin (Sn) plated surface, or other solderable or laser-weldable plated surface. In example implementations, busbar tab 310 and busbar tab 320 may be soldered or laser-welded to beam 110B and beam 120B, respectively.

In example implementations, an integrated power electronics package may be modular and may include multiple power electronics modules (or sub-packages) in a single package for use in various applications (e.g., three-phase inverters; DC/DC convertors; choppers; half or full bridge; and power supply applications, etc.). For example, an integrated power electronics package for many automotive applications may integrate three power electronics module (e.g., power electronics module 200) in a 3-pack configuration. The multiple power electronics modules (or sub-packages) (e.g., power electronics module 200) may be placed electrically in parallel in a casing or housing. The casing or housing may be made of insulating polymeric material with high temperature resistance and high flexural strength as well as high dielectric withstand capabilities to prevent shorting on the terminals. The polymeric material may, for example, be polyphthalamide (PPA/PA), polyphenylene sulfide (PPS), polyetherketone (PEK/PEEK), polyethersulfone (PES), or polybutylene Terephthalate (PBT).

Figure 3:
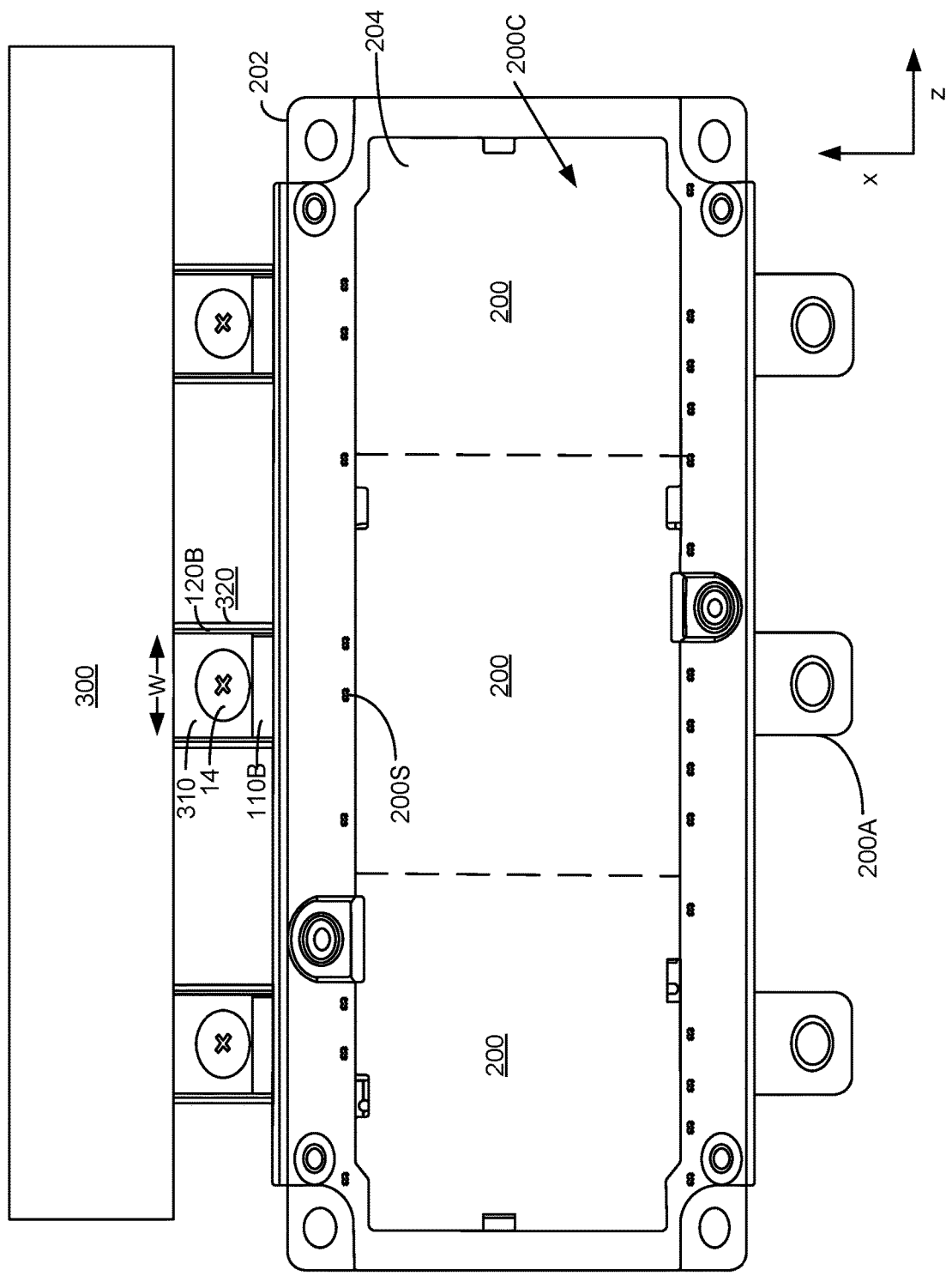
FIG. 3 illustrates a top view of a power device package that includes three power electronics modules of FIG. 1 with power terminals of the power electronics modules coupled to a busbar of an application system.
Figure 4:
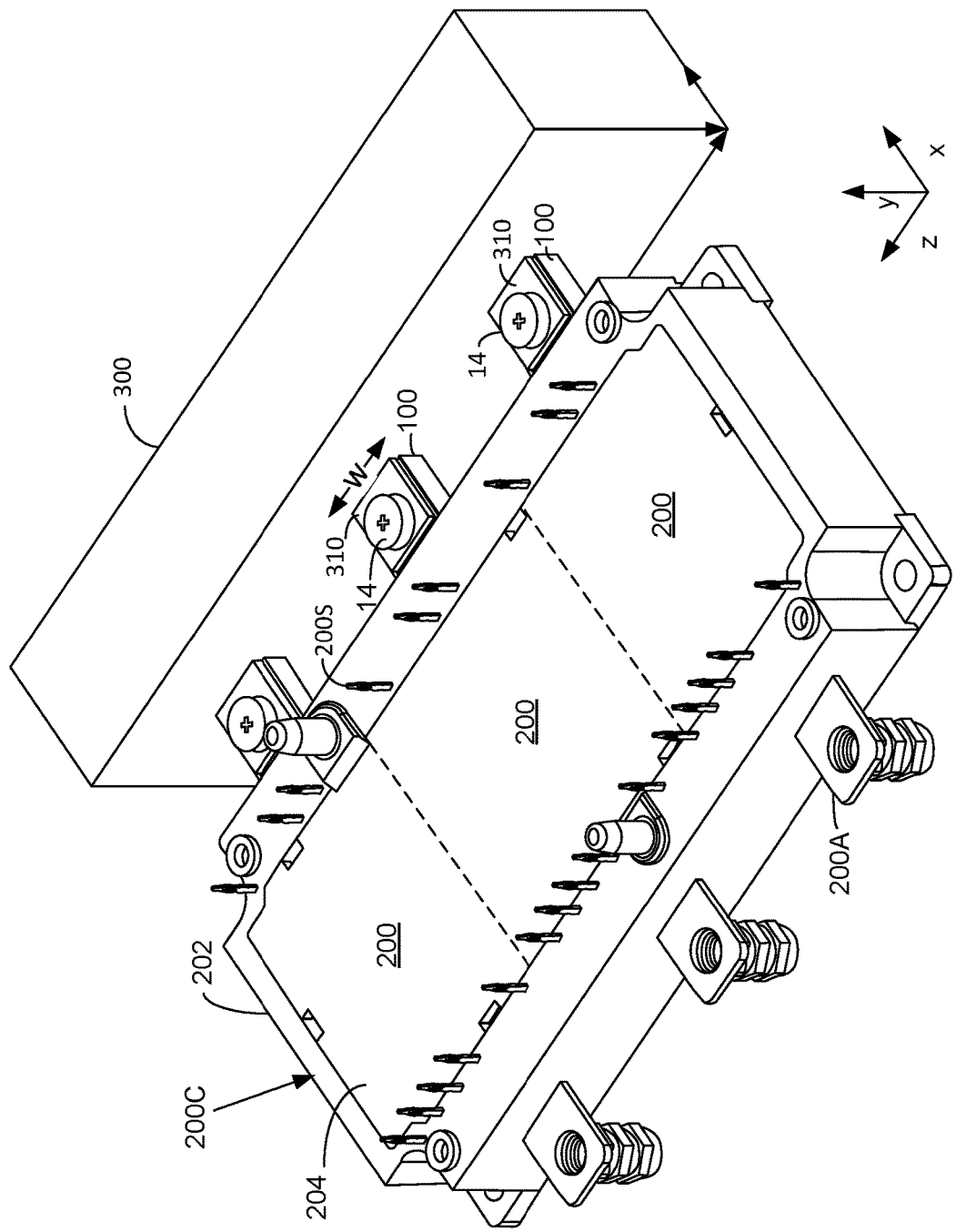
FIG. 4 illustrates a perspective side view of the power device package of FIG. 3.

FIG. 3 and FIG. 4 show a top view and a side perspective view of a package 400 that includes three power electronics modules (power electronics module 200) in a 3-pack configuration in a box-like casing 200C. Box-like casing 200C may be made of plastic, thermoplastic materials such as polybutylene terephthalate (PBT), or other polymeric materials. Each of the three power electronics modules in has a pair of DC power terminals (e.g., DC power terminal 110 and DC power terminal 120) extending, for example, in arrangement 100 from edge 202 of casing 200C. Further, each of the three power electronics modules may also have an AC power terminal (e.g., AC power terminal 200A) and several signal terminals (e.g., pin 200S) extending from edge 202 to the exterior of casing 200C.

Further, as shown in FIG. 3 and FIG. 4, each pair of DC power terminals (e.g., in arrangement 100) extending in arrangement 100 from edge 202 of casing 200C can be coupled to a busbar (e.g., busbar 300) of an application system using busbar tabs (e.g., busbar tab 310 and busbar tab 320) as discussed previously with respect to FIG. 1. The busbar tabs (e.g., busbar tab 310 and busbar tab 320) are aligned vertically (in the y direction) one above the other and are held together with the power terminal beams (beam 110B and beam 120B) by a single screw 14 (of the screw-washer-nut assembly 20, FIG. 1).

In other example implementations, the arrangement of the DC power terminals to minimize or reduce stray induction may involve power terminals of different size or shape than shown in FIGS. 1 through 5. In some example arrangements that involve large size power terminals (e.g., larger than shown in FIGS. 1 through 5) more than one screw (e.g., two screws) may be used to couple the power terminals to busbar tabs of an application system busbar.

Figure 5:
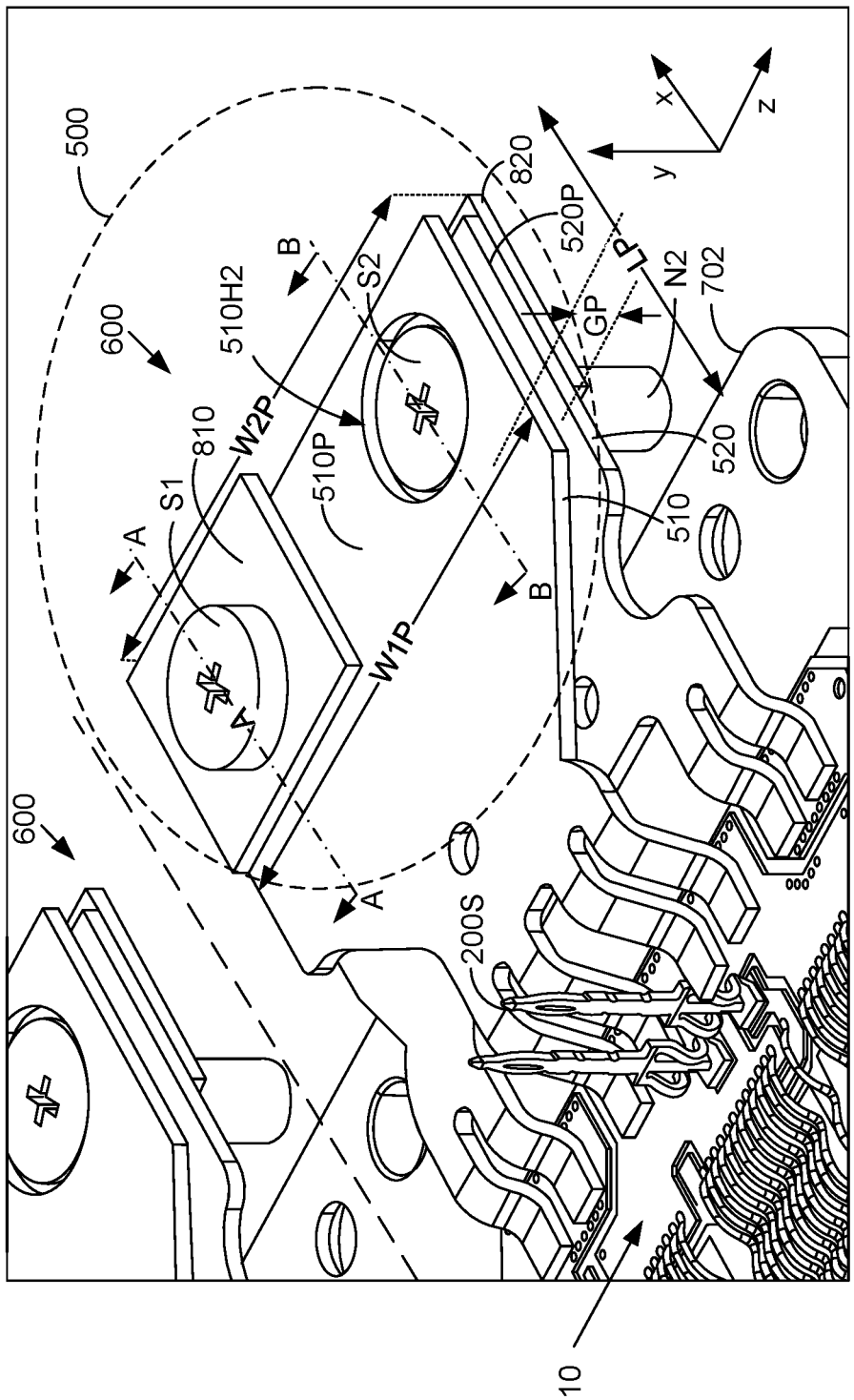
FIG. 5 illustrates a perspective side view of an example arrangement of the power terminals of a power electronics module with a top cover of a casing enclosing of the power electronics module removed.
Figure 6B:
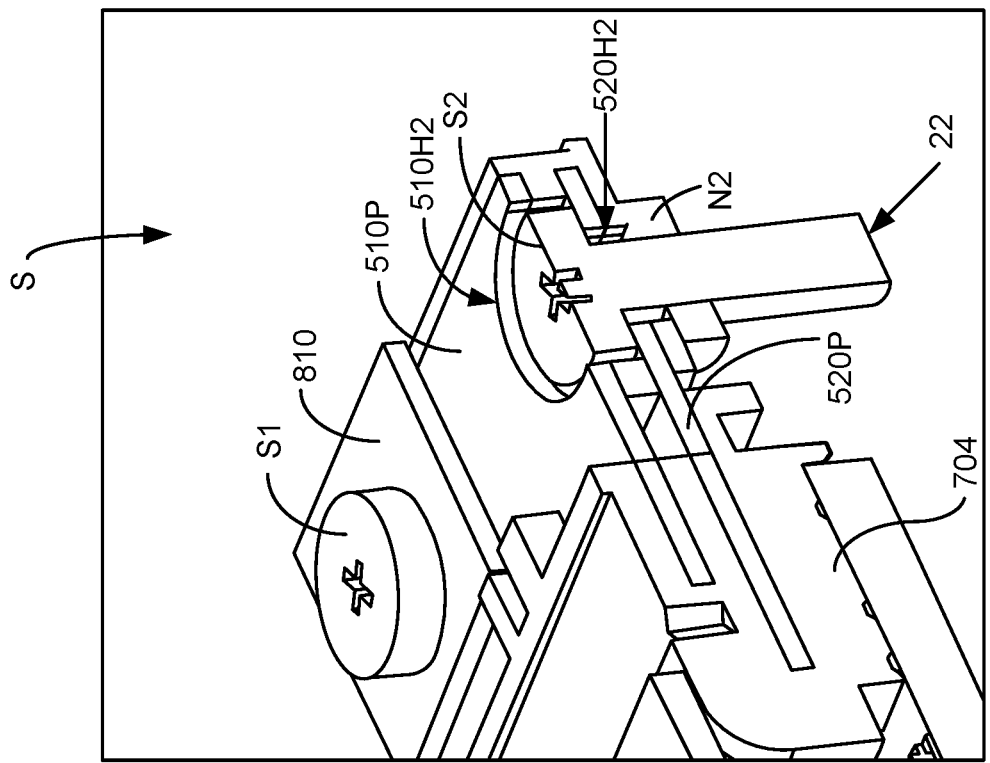
FIG. 6A and FIG. 6B show cross-sectional side views of portions of the arrangement of the power terminals of FIG. 5.
Figure 6A:
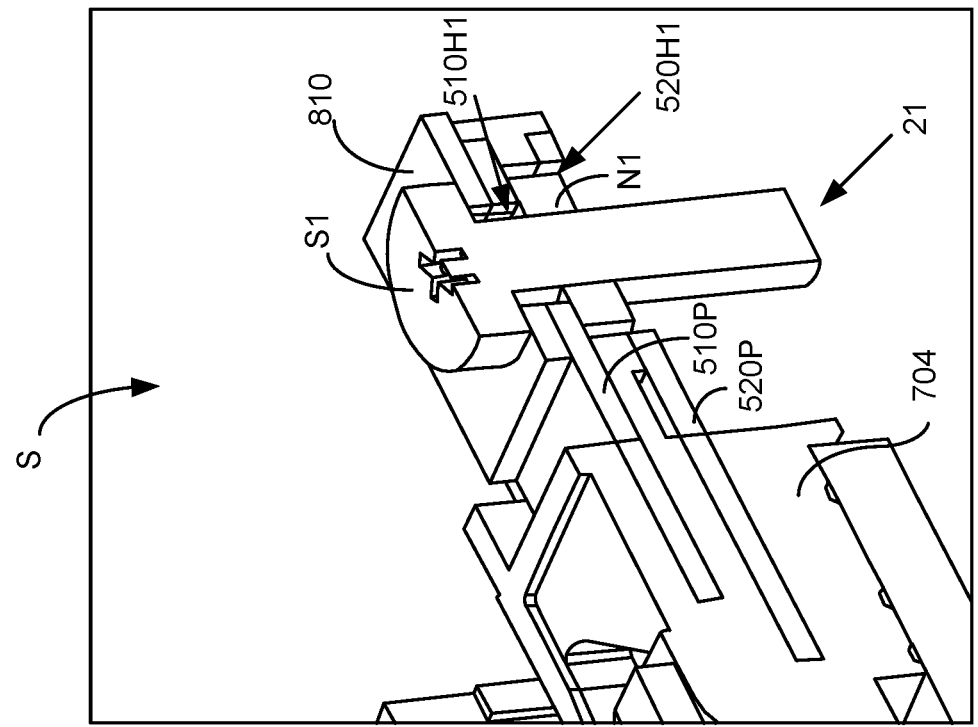

FIG. 5 shows a perspective side view of an example arrangement 500 of the power terminals (e.g., DC power terminal 510 and DC power terminal 520) in an example power electronics module 600. The power electronics module may be one of several power electronics module enclosed in a casing of a power electronics package (e.g., casing cover 704 of casing 700C, FIG. 7). FIG. 5 shows a view of a power electronics module 600 with a top cover (e.g., casing cover 704) of the casing (e.g., casing 700C) enclosing of the power electronics module removed. Only an edge portion (e.g., edge 702) of the casing (e.g., casing 700C) enclosing power electronics module 600 is shown in FIG. 5. FIG. 5 also shows busbar tabs (e.g., busbar tab 810, and busbar tab 820) of an application system (e.g., busbar 800, FIG. 7) connected to the power terminals (i.e., DC power terminal 510 and DC power terminal 520) of power electronics module 600. For visual clarity, busbar 800 itself is not shown in FIG. 5. FIG. 6A and FIG. 6B show side views of portions of arrangement 500 taken along direction A-A and direction B-B in FIG. 5, respectively.

As shown in FIG. 5, DC power terminal 510 and DC power terminal 520 may be made of strips of metal that extend (generally in the x direction) from the casing enclosing power electronics module 600. DC power terminal 510 and DC power terminal 520 may, in general, have mutually conformal shapes and mostly lie one above the other. As shown in FIG. 5, for example, DC power terminal 510 (e.g., a DC+power terminal) may include a flat plate portion (e.g., plate 510P) extending away from the edge portion of power electronics module 600 in the x direction, and DC power terminal 520 (e.g., a DC−power terminal) may include a flat plate portion (e.g., plate 520P) extending away from the edge portion of power electronics module 600 in the x direction. In example implementations, plate 510P and plate 520P may extend to about a length LP (e.g., in the x direction) away from the edge portion of electronics module 600. Plate 510P and plate 520P may have widths WP1 and WP2, respectively (in the z direction). Further, plate 510P and plate 520P may have a thickness TP1 and a thickness TP2, respectively (in the y direction) (not marked in FIG. 5).

In arrangement 500, flat plate portion (e.g., plate 520P) of DC power terminal 510 and flat portion (e.g., plate 520P) of DC power terminal 520 may be disposed in stack one above the other (e.g., in a vertical stack with plate 510P disposed above plate 520P) with a distance or gap GP (in the y direction) between the two plates.

In example implementations, an insulating material layer may be disposed in gap GP between the two plates (e.g., for increased creepage in arrangement 500). The insulating material layer may, for example, be material of the casing.

In example implementations, plate 510P and plate 520P may be spaced apart by the insulating material of the cover of casing 700C (FIG. 7) (not shown in FIG. 5).

Plate 510P and plate 520P may have pairs of holes (e.g., hole 510H1 and hole 510H2, and hole 520H1 and hole 520H2, FIG. 6A and FIG. 6B) extending through the thicknesses of the plates. In FIG. 5 only hole 510H2 in plate 510P is visible. The other holes being underneath or behind other features shown are not visible. As shown in FIG. 6A, hole 510H1 in plate 510P may be aligned with hole 520H1 in plate 520P to accommodate a screw and a nut (e.g., screw S1 and nut N1) of a screw-and-nut assembly 21. Further, as shown in FIG. 6B, hole 510H2 in plate 510P may be aligned with hole 520H2 in plate 520P accommodate a screw and a nut (e.g., screw S2 and nut N2) of a screw-and-nut assembly 22).

In example implementations, for an instance where power electronics module 200 is an SSDC package, the flat plate portion (e.g., plate 510P) of DC power terminal 510 and flat portion (e.g., plate 520P) of DC power terminal 520 may have the following example dimensions: length LP may be between about 10 mm and 20 mm (e.g., 15 mm); widths WP1 and WP2 may be between about 10 mm and 50 mm (e.g., 35 mm); and thickness TP1 and TP2 may be each between about 1.0 mm and 2 mm (e.g., 1 mm, 1.5 mm, etc.).

In example implementations, the distance or gap GP between plate 510P of DC power terminal 510 (e.g., a DC+power terminal) and plate 520P of DC power terminal 520 (e.g., a DC−power terminal) may be between about 1 mm and 2 mm (e.g., 1.5 mm, etc.).

Figure 7:
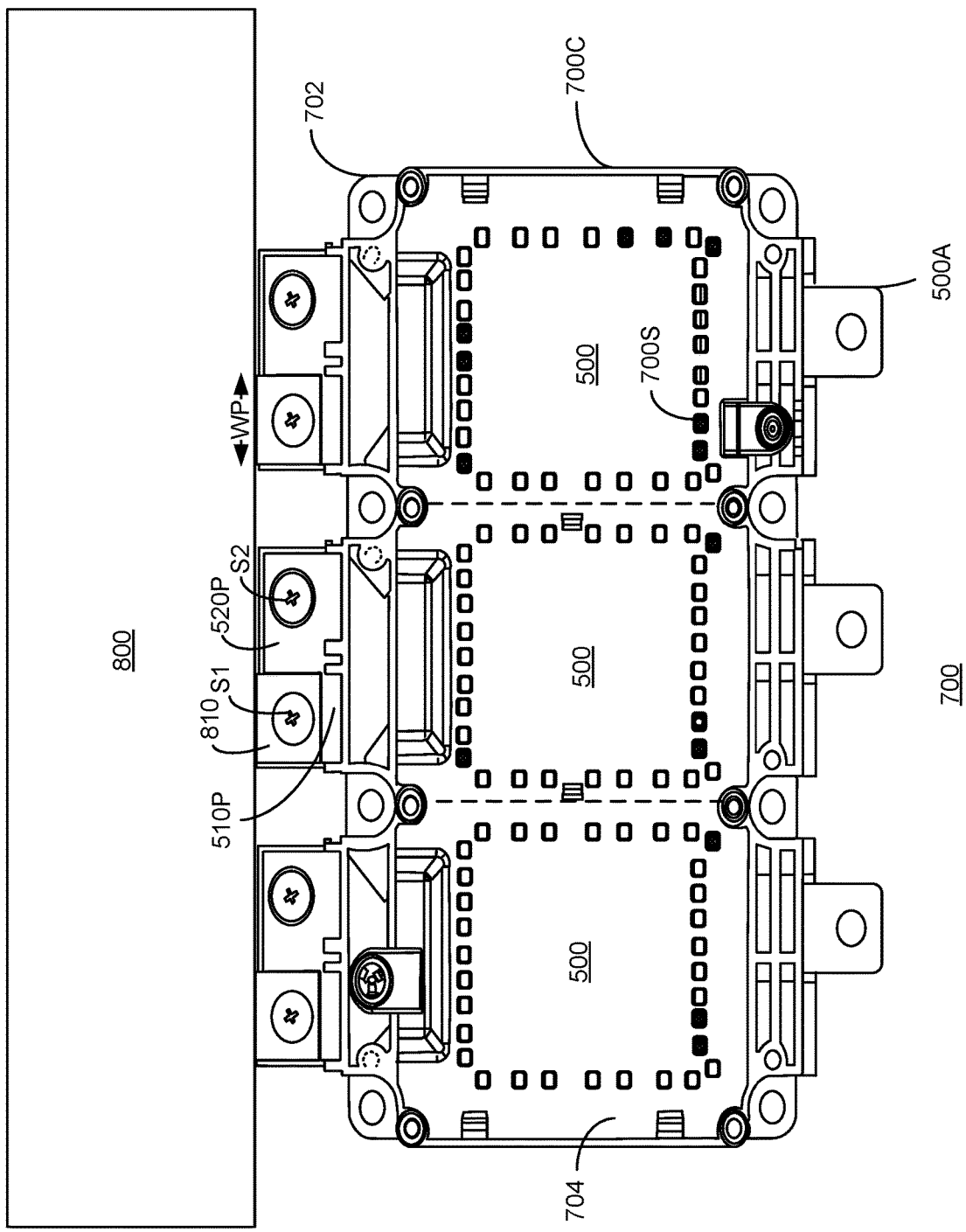
FIG. 7 illustrates a top view of a power device package that includes three power electronics modules of FIG. 5 with power terminals of the power electronics modules coupled to a busbar of an application system.

As shown in FIG. 5, busbar 800 of FIG. 7 may be coupled to power electronics module 600 by respectively coupling busbar tab 810 and busbar tab 820 (extending, e.g., in the −x direction, from busbar 800) to plate 510P and plate 520P of the power terminals of the power electronics module.

Busbar tab 810 and busbar tab 820 may, for example, be rectangular pieces of metal or other conductive material. Busbar tab 810 and busbar tab 820 may have comparable rectangular dimensions and may extend from a side S of from busbar 800. Busbar tab 810 may lie above (e.g., in the y direction) and to a side (in the z direction) of busbar tab 820. Busbar tab 810 and busbar tab 820 may each have a width WP (in the z direction) that is smaller than the width (width WP1 and WP2) of DC power terminal 510 or DC power terminal 520.

In example implementations, to couple power electronics module 600 to busbar 800, busbar tab 810 may be positioned to contact a top surface of plate 510P from above, and busbar tab 820 may be positioned to contact a bottom surface of plate 520P from below.

As shown in FIG. 6A, the assembly of busbar tab 810 and plate 510P may be held together by an insulating screw-and-nut assembly 21 (including, e.g., screw S1, and nut N1). Hole 520H1 in plate 520P (that is aligned with hole 510H1 in plate 520P) may be sufficiently large (e.g., like a counterbore hole) to allow nut N1 to pass through plate 520P and bear directly on plate 510P (that is aligned with hole 510H1).

Further, as shown in FIG. 6B, the assembly of busbar tab 820 and plate 510P may be held together by an insulating screw-and-nut assembly 21 (including, e.g., screw S2, and nut N2). Hole 510H2 in plate 510P (that is aligned with hole 520H2 in plate 520P) may be sufficiently large (e.g., like a counter-bore hole) to allow a head of screw S2 to pass through plate 520P and bear directly on plate 520P.

In example implementations, busbar tab 810 and busbar tab 820 may be made of metal (e.g., copper) with a bare surface, a tin-nickel (Sn—Ni) plated surface, a tin (Sn) plated surface, or other solderable or laser-weldable plated surface. In example implementations, busbar tab 810 and busbar tab 820 may be soldered or laser-welded to plate 510P and plate 520P, respectively.

The close spacing (e.g., 1 mm to 2 mm) between major surfaces of the plate portions of DC power terminal 510 and DC power terminal 520, and the generally conformal shapes of DC power terminal 510 and DC power terminal 520 will reduce any stray inductance associated with a DC+/DC−power terminal loop created through the power terminals when power electronics module 600 is coupled to a busbar (e.g., busbar 800, FIG. 7) of an application system.

FIG. 7 illustrates a top view of a power device package 700 that includes three power electronics modules of FIG. 5 with power terminals of the power electronics modules coupled to a busbar of an application system.

In example implementations, power device package 700 may be modular and may include multiple power electronics modules (or sub-packages) in a single package for use in various applications (e.g., three-phase inverters; DC/DC convertors; choppers; half or full bridge; automotive applications and power supply applications, etc.). The multiple power electronics modules (e.g., power electronics module 600) may be placed electrically in parallel in a casing 700C. These power electronics module 600 are placed in casing 700C under casing cover (e.g., cover 704) and therefore are not fully visible in FIG. 7. The multiple power electronics modules have various power terminals (e.g., DC terminals, AC terminals, signal terminals, etc.) that extend from within casing 700C to the exterior of casing 700C. At least some of these are visible or at least partially visible in FIG. 7.

Each of the three power electronics modules in has a pair of DC power terminals (e.g., DC power terminal 510 and DC power terminal 520) extending, for example, in arrangement 500 from edge 702 of casing 700C. Further, each of the three power electronics modules may also have an AC power terminal (e.g., AC power terminal 500A) and several signal terminals (e.g., pin 700S) extending from edge 202 to the exterior of casing 700C.

Further, as shown in FIG. 7, each pair of DC power terminals (e.g., in arrangement 500) extending from edge 702 of casing 700C can be coupled to a busbar (e.g., busbar 800) of an application system using busbar tabs (e.g., busbar tab 810 and busbar tab 820) as discussed previously with respect to FIG. 5, FIG. 6A and FIG. 6B. Busbar tab 810 is coupled to the power terminal plate (e.g., plate 510P) by a single screw S1 (of the screw-and-nut assembly 21, FIG. 6A). Busbar tab 810 is coupled to the power terminal plate (e.g., plate 520P) by a single screw S2 (of the screw-and-nut assembly 22, FIG. 6B).

The close spacing (e.g., 1 mm to 2 mm) between major surfaces of the plate portions of DC power terminal 510 and DC power terminal 520, and the generally conformal shapes of DC power terminal 510 and DC power terminal 520 will reduce any stray inductance associated with a DC+/DC− power terminal loop created through the power terminals when power electronics module 600 is coupled to a busbar (e.g., busbar 800, FIG. 7) of an application system.

Figure 8:
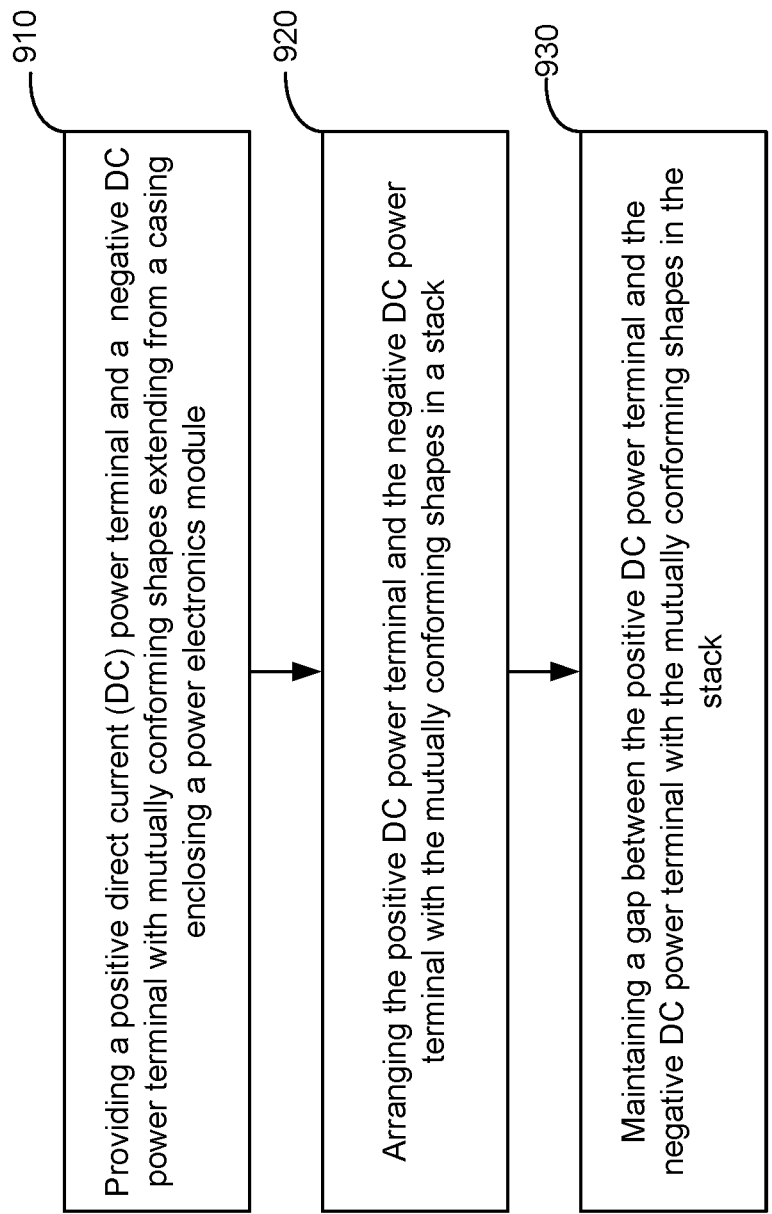
FIG. 8 illustrates an example method for reducing stray inductance associated with power terminals of a power electronics module.

FIG. 8 shows an example method 900 for reducing stray inductance associated with DC+ and DC power terminals of a power electronics module.

Method 900 includes providing a DC+power terminal and a DC− power terminal with mutually conforming shapes extending from a casing enclosing a power electronics module (910), arranging the DC+power terminal and the DC−power terminal with the mutually conforming shapes in a stack (920), and maintaining a gap between the DC+power terminal and the DC− power terminal with the mutually conforming shapes in the stack (930).

In some example implementations, providing the DC+power terminal and the DC− power terminal with mutually conforming shapes includes providing terminals made of a sheet of metal.

In some example implementations, the mutually conforming shapes includes a shape of a beam.

In some example implementations, the mutually conforming shapes includes a shape of a flat plate.

In some example implementations, the mutually conforming shapes includes a shape of a flat rectangular plate.

In example implementations, maintaining the gap between the DC+power terminal and the DC− power terminal in the stack includes maintaining a distance between a major surface of the DC+power terminal and a major surface of the DC− power terminal in the stack.

In some example implementations, maintaining the distance between the major surface of the DC+power terminal and a major surface of the DC−power terminal in the stack includes keeping a spacing of less than 5 mm.

In some example implementations, maintaining the distance between the major surface of the DC+power terminal and a major surface of the DC−power terminal in the stack includes keeping a spacing of less than 3 mm.

In some example implementations, maintaining the distance between the major surface of the DC+power terminal and a major surface of the DC−power terminal in the stack includes keeping a spacing of less than 2 mm.

In some example implementations, maintaining the distance between the major surface of the positive DC power terminal and a major surface of the negative DC power terminal in the stack includes disposing an insulating material layer in the gap.

The various implementations described herein are given only by way of example and only for purposes of illustration. It will be understood, for purposes of this disclosure, that when an element, such as a layer, a region, a component, or a substrate, is referred to as being on, mechanically connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application may be amended to recite exemplary relationships described in the specification and or shown in the figures.

As used in this specification, a singular form may, unless indicating a particular case in the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Some implementations may be implemented using various semiconductor processing and/or packaging techniques. Some implementations may be implemented using various types of semiconductor processing techniques associated with semiconductor substrates including, but not limited to, for example, silicon (Si), silicon carbide (SiC), gallium arsenide (GaAs), gallium nitride (GaN), and/or so forth.

While certain features of the described implementations have been illustrated as described herein, many modifications, substitutions, changes, and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A module comprising:
    a power circuit enclosed in a casing;
    a first power terminal and a second power terminal of the power circuit, each extending to an exterior of the casing,
    the first power terminal and the second power terminal separated by a gap being disposed in a stack on the exterior of the casing,
    the first power terminal having a first hole extending therethrough, the second power terminal having a second hole extending therethrough and aligned with the first hole; and a mechanical fastener coupled to the second power terminal through the second hole and recessed within the first hole.

2. The module of claim 1, wherein the first power terminal is a DC+power terminal and the second power terminal is a DC-power terminal.

3. The module of claim 1, wherein the first power terminal and the second power terminal are each a strip of metal.

4. The module of claim 1, wherein the first power terminal and the second power terminal each have a shape of a beam.

5. The module of claim 1, wherein the first power terminal and the second power terminal each have a shape of a flat rectangular plate on the exterior of the casing.

6. The module of claim 1, wherein the first power terminal and the second power terminal are made of metal, and each has a bare surface, a tin-nickel (Sn—Ni) plated surface, a tin plated surface, a solderable or a laser-weldable plated surface for connection to a busbar of an application system.

7. The module of claim 1, wherein the mechanical fastener is a first mechanical fastener, the first power terminal has a third hole extending therethrough, the second power terminal has a fourth hole extending therethrough and aligned with the third hole, the module further includes a second mechanical fastener coupled to the first power terminal through the third hole and the fourth hole.

8. The module of claim 1, further comprising:
an insulating material disposed in the gap separating the first power terminal and the second power terminal in the stack on the exterior of the casing.

9. A package, comprising:
a power electronics module enclosed in a casing, the casing made of polymeric materials;
a first power terminal and a second power terminal, each extending to an exterior of the casing,
the first power terminal and the second power terminal having mutually conforming shapes and being arranged in stack on the exterior of the casing with a gap between the first power terminal and the second power terminal, the first power terminal having a first hole extending therethrough, the second power terminal having a second hole extending therethrough; and
a mechanical fastener coupled to the second power terminal through the second hole and recessed within the first hole.

10. The package of claim 9, wherein the first power terminal and the second power terminal are each made of a strip of metal.

11. The package of claim 9, wherein the gap corresponds to a distance of less than 5 mm between a major surface of the first power terminal and a major surface of the second power terminal.

12. The package of claim 9, wherein the first power terminal and the second power terminal each have a shape of a beam.

13. The package of claim 9, wherein the first power terminal and the second power terminal each have a shape of a flat rectangular plate on the exterior of the casing.

14. A method, comprising:
arranging a positive direct current power terminal and a negative direct current power terminal with mutually conforming shapes to extend from a casing enclosing a power electronics module, the positive direct current power terminal and the negative direct current power terminal being arranged in a stack, the positive direct current power terminal having a first hole extending therethrough, the negative direct current power terminal having a second hole extending therethrough and aligned with the first hole;
maintaining a gap between the positive direct current power terminal and the negative direct current power terminal in the stack; and
coupling a mechanical fastener to the negative direct current power terminal through the first hole and the second hole, the first hole having a diameter larger than the second hole.

15. The method of claim 14, wherein the positive direct current power terminal and the negative direct current power terminal with mutually conforming shapes are each made of a sheet of metal.

16. The method of claim 14, wherein the mutually conforming shapes includes a shape of a beam.

17. The method of claim 14, wherein the mutually conforming shapes includes a shape of a flat rectangular plate.

18. The method of claim 14, wherein maintaining the gap between the positive direct current power terminal and the negative direct current power terminal in the stack includes maintaining a distance between a major surface of the positive direct current power terminal and a major surface of the negative direct current power terminal in the stack.

19. The method of claim 18, wherein maintaining the distance between the major surface of the positive direct current power terminal and a major surface of the negative direct current power terminal in the stack includes keeping a spacing of less than 5 mm.

20. The method of claim 18, wherein maintaining the distance between the major surface of the positive direct current power terminal and a major surface of the negative direct current power power terminal in the stack includes keeping a spacing of less than 3 mm.

21. The method of claim 18, wherein maintaining the distance between the major surface of the positive direct current power terminal and a major surface of the negative direct current power terminal in the stack includes disposing an insulating material layer in the gap.

22. The method of claim 18, further comprising:
coupling the positive direct current power terminal and the negative direct current power terminal with the mutually conforming shapes to a busbar of an application system.

* * * * *